US009654125B2

(12) United States Patent
Nakajima

(10) Patent No.: US 9,654,125 B2
(45) Date of Patent: May 16, 2017

(54) ATOM CELL, QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Takuya Nakajima, Ushiku (JP)

(73) Assignee: Seiko Epson Corporation (JP)

( * ) Notice: Subject to any disclaimer, the term of this patent is extended or adjusted under 35 U.S.C. 154(b) by 85 days.

(21) Appl. No.: 14/728,234

(22) Filed: Jun. 2, 2015

(65) Prior Publication Data

US 2015/0349791 A1 Dec. 3, 2015

(30) Foreign Application Priority Data

Jun. 3, 2014 (JP) .................................. 2014-114636

(51) Int. Cl.
| | | |
|---|---|---|
| *H01S 1/06* | (2006.01) | |
| *H03L 7/26* | (2006.01) | |
| *G04F 5/14* | (2006.01) | |

(52) U.S. Cl.
CPC ............... *H03L 7/26* (2013.01); *G04F 5/145* (2013.01); *H01S 1/06* (2013.01)

(58) Field of Classification Search
CPC ... H03L 7/26; G04F 5/14; G04F 5/145; H01S 1/06
USPC ..................................................... 331/3, 94.1
See application file for complete search history.

(56) References Cited

U.S. PATENT DOCUMENTS

| | | | | |
|---|---|---|---|---|
| 8,258,884 B2* | 9/2012 | Borwick, III | ........... | G04F 5/145 331/3 |
| 2010/0026394 A1* | 2/2010 | Davis | ........................ | H03L 7/26 331/3 |
| 2013/0015920 A1 | 1/2013 | Sato et al. | | |
| 2013/0194046 A1* | 8/2013 | Schober | ................ | G01C 19/66 331/94.1 |
| 2013/0300510 A1* | 11/2013 | Tamura | ..................... | H03L 1/02 331/69 |
| 2014/0225678 A1* | 8/2014 | Yano | ...................... | G01R 33/26 331/94.1 |
| 2015/0027908 A1* | 1/2015 | Parsa | ........................ | F17C 3/00 206/0.7 |
| 2015/0028866 A1* | 1/2015 | Parsa | ................... | G01R 33/032 324/252 |

FOREIGN PATENT DOCUMENTS

| | | | |
|---|---|---|---|
| JP | H06-152407 A | | 5/1994 |
| JP | 2010-205875 | * | 9/2010 |
| JP | 2013-038382 A | | 2/2013 |
| JP | 2014-053661 A | | 3/2014 |

* cited by examiner

*Primary Examiner* — Richard Tan
(74) *Attorney, Agent, or Firm* — Harness, Dickey & Pierce, P.L.C.

(57) ABSTRACT

A gas cell includes an alkali metal, a pair of window parts, a body part provided between the pair of window parts and forming an internal space in which the alkali metal in a gaseous state is enclosed with the pair of window parts, and a space within a recessed part forming a part of the internal space or communicating with the internal space, in which a liquid-state or solid-state alkali metal is placed, and a bottom part as a wall part between the space within the recessed part and an outside has a smaller thickness than the window parts.

10 Claims, 11 Drawing Sheets

ATOM CELL, QUANTUM INTERFERENCE DEVICE, ATOMIC OSCILLATOR, ELECTRONIC APPARATUS, AND MOVING OBJECT

CROSS REFERENCE

This application claim benefit of Japanese Application JP 2014-114636, filed on Jun. 3, 2014. The disclosure of the prior application is hereby incorporated by reference herein in its entirety.

BACKGROUND

1. Technical Field

The present invention relates to an atom cell, a quantum interference device, an atomic oscillator, an electronic apparatus, and a moving object.

2. Related Art

As oscillators having high-accuracy oscillation characteristics on a long-term basis, atomic oscillators that oscillate based on energy transition of atoms of alkali metals including rubidium and cesium are known.

Generally, the operation principle of the atomic oscillators is roughly classified into a system using a double resonance phenomenon by light and microwave and a system using a quantum interference effect (CPT: Coherent Population Trapping) by two kinds of lights having different wavelengths.

In either system of atomic oscillator, typically, an alkali metal is enclosed within a gas cell (atom cell) and the gas cell is heated to a predetermined temperature by a heater so that the alkali metal may be kept in a fixed gas condition.

Or, for example, as disclosed in Patent Document 1 (JP-A-2013-38382), generally, an excessive alkali metal is enclosed in consideration of reduction over time of the alkali metal within the gas cell. The excessive alkali metal is precipitated (condensed) in a part at the lower temperature of the gas cell and exists as a liquid.

However, in related art, the excessive alkali metal attaches to a passage region of excitation light, an amount of excitation light applied to the alkali metal varies and decreases, and thereby, the frequency varies and, as a result, a problem of reduction in frequency stability arises. Particularly, when the atomic cells become smaller with recent requests for downsizing of atomic oscillators etc., the temperature difference between the excitation light passage region and the other regions becomes smaller and the alkali metal attaches to the excitation light passage region more easily, and thereby, the problem becomes significant.

SUMMARY

An advantage of some aspects of the invention is to provide an atom cell that may improve frequency stability and, a quantum interference device, an atomic oscillator, an electronic apparatus, and a moving object including the atom cell.

The invention can be implemented as the following forms or application examples.

Application Example 1

An atom cell according to an application example of the invention includes a metal, a pair of window parts, a body part provided between the pair of window parts and forming an internal space in which the metal is enclosed in a gaseous state with the pair of window parts, and a metal reservoir part forming a part of the internal space or communicating with the internal space, in which the metal is placed in a liquid state or solid state, wherein a wall part forming the metal reservoir part between the space and an outside has a thinner part having a smaller thickness than the window parts.

According to the atom cell, the thickness of the thinner part provided in the wall part between the space (region) forming the metal reservoir part and the part of the outside is thinner than the thickness of the window parts, and the thinner part is radiated or cooled more easily than the window parts. Therefore, the excessive metal maybe condensed into a liquid state or solid state on the inner surface of the thinner part more easily than on the inner surfaces of the window parts. Accordingly, even when the atom cell is downsized, the excessive metal may be selectively and efficiently condensed on the inner surface of the thinner part while the condensation of the excessive metal on the inner surfaces of the window parts is reduced. As a result, frequency stability may be improved.

Application Example 2

In the atom cell according to the application example of the invention, it is preferable that a substrate including the window part and stacked on the body part and a recessed part provided in a position overlapping with the metal reservoir part as seen from a thickness direction of the substrate and opening to the substrate are provided.

With this configuration, the thinner part may be provided at the window part side of the atom cell. Further, the structure including the body part and the substrate may be easily and precisely formed using etching. Accordingly, the atom cell may be easily downsized.

Application Example 3

In the atom cell according to the application example of the invention, it is preferable that the recessed part penetrates the substrate.

With this configuration, the thinner part may be formed using the constituent material of the body part. Accordingly, as the constituent material of the body part, a material having better thermal conductivity than the constituent material of the window is selected and used, and thereby, heat radiation of the thinner part may be improved.

Application Example 4

In the atom cell according to the application example of the invention, it is preferable that the body part is formed to contain silicon.

Microfabrication by etching can be performed on silicon. Therefore, even when the atom cell is downsized, the body part may be formed easily and precisely. Further, generally, the window parts are formed using glass, and the silicon is better in thermal conductivity than glass. Therefore, heat radiation of the thinner part may be made better. Further, when the window parts are formed using glass, the body part and the window parts may be easily and air-tightly bonded by anodic bonding and reliability of the atom cell may be made better.

Application Example 5

In the atom cell according to the application example of the invention, it is preferable that the substrate is formed to contain glass.

With this configuration, the window parts having transmissivity with respect to the excitation light may be realized. Further, when the body part is formed using silicon, the body part and the window parts may be easily air-tightly bonded by anodic bonding and the reliability of the atom cell may be made better.

Application Example 6

In the atom cell according to the application example of the invention, it is preferable that the body part and the substrate are directly bonded or anodically bonded.

With this configuration, the body part and the window parts may be easily air-tightly bonded and the reliability of the atom cell may be made better.

Application Example 7

In the atom cell according to the application example of the invention, it is preferable that the atom cell further includes a cooling unit configured to cool the thinner part.

With this configuration, the heat of the thinner part may be efficiently radiated or cooled.

Application Example 8

A quantum interference device according to an application example of the invention includes the atom cell according to the application example of the invention.

With this configuration, the quantum interference device having advantageous frequency stability may be provided.

Application Example 9

An atomic oscillator according to an application example of the invention includes the atom cell according to the application example of the invention.

With this configuration, the atomic oscillator having advantageous frequency stability may be provided.

Application Example 10

An electronic apparatus according to an application example of the invention includes the atom cell according to the application example of the invention.

With this configuration, the electronic apparatus including the atom cell that may improve frequency stability may be provided.

Application Example 11

A moving object according to an application example of the invention includes the atom cell according to the application example of the invention.

With this configuration, the moving object including the atom cell that may improve frequency stability may be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, an atom cell, a quantum interference device, an atomic oscillator, an electronic apparatus, and a moving object according to the invention will be explained in detail based on embodiments shown in the accompanying drawings.

1. Atomic Oscillator (Quantum Interference Device)

First, the atomic oscillator according to the invention (the atomic oscillator including the quantum interference device according to the invention) will be explained. Note that an example of application of the quantum interference device according to the invention to the atomic oscillator will be explained as below, however, the quantum interference device according to the invention may be applied not only to the atomic oscillator but also to e.g. a magnetic sensor, a quantum memory, or the like.

First Embodiment

Figure 1:
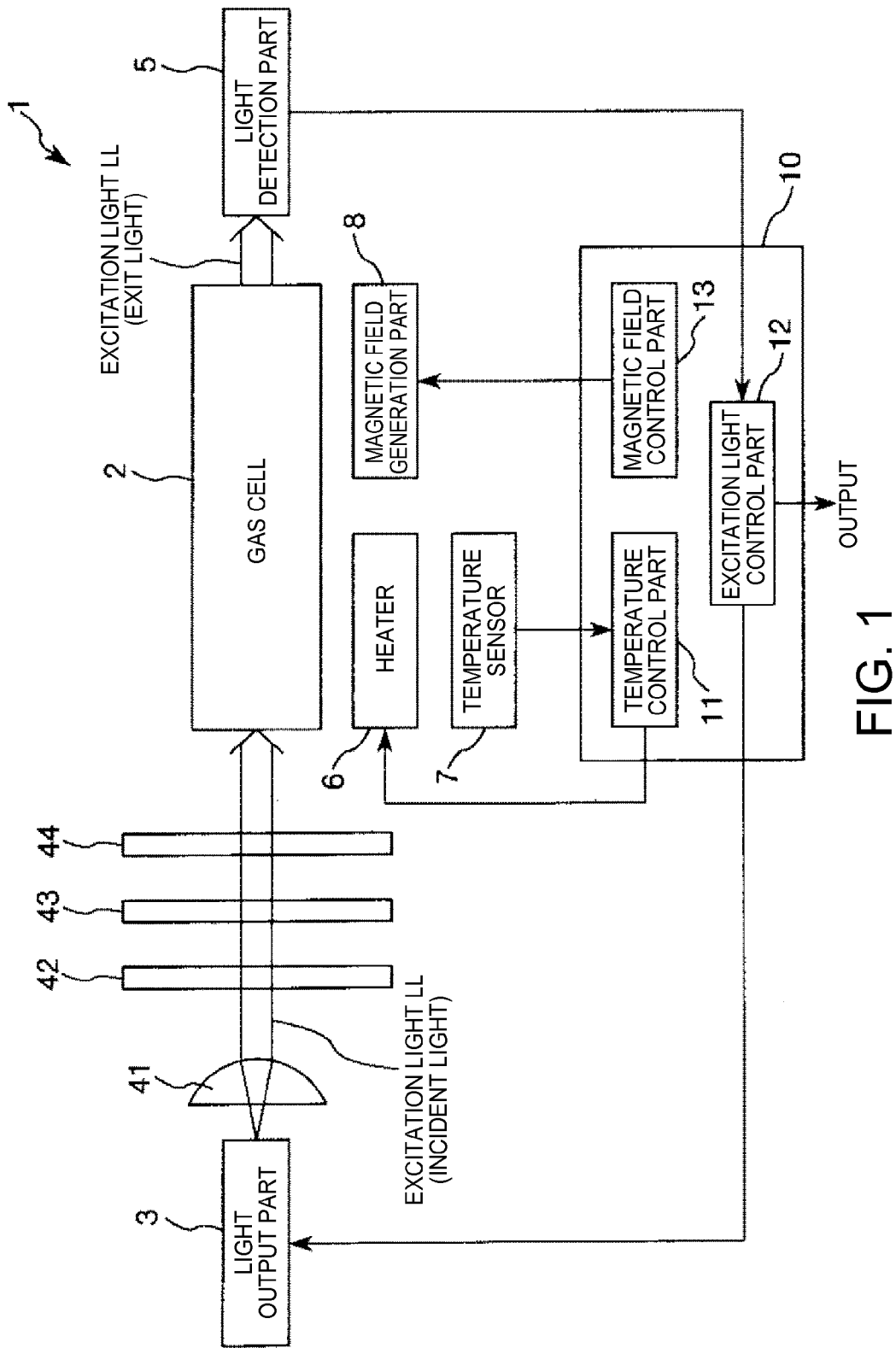
FIG. 1 is a schematic diagram showing an atomic oscillator (quantum interference device) according to the first embodiment of the invention.
Figure 2:
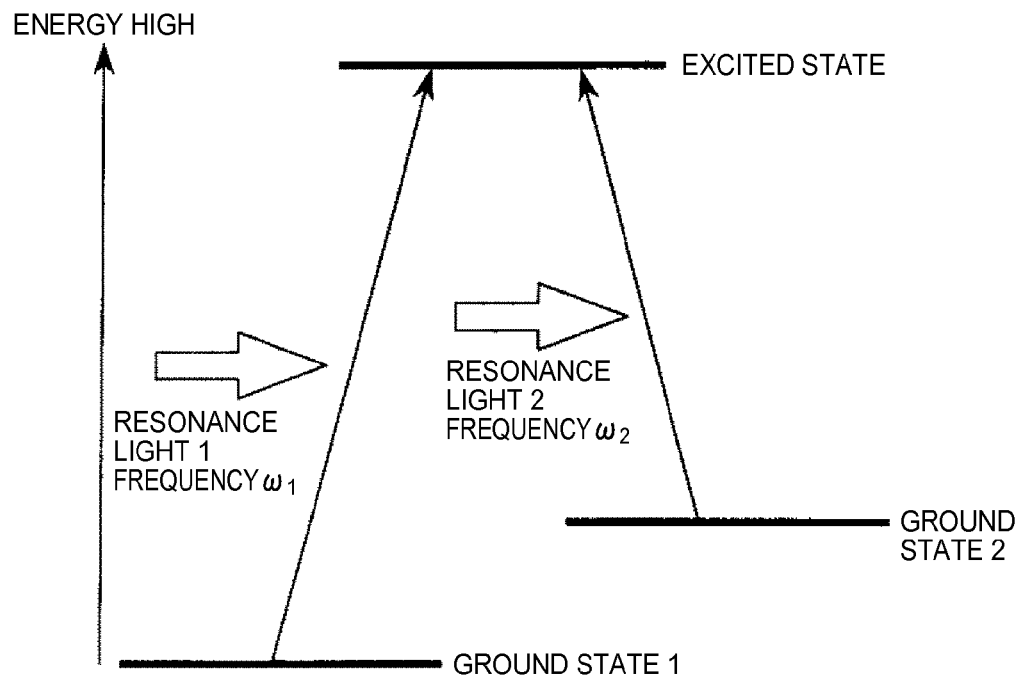
FIG. 2 is a diagram for explanation of energy states of an alkali metal.
Figure 3:
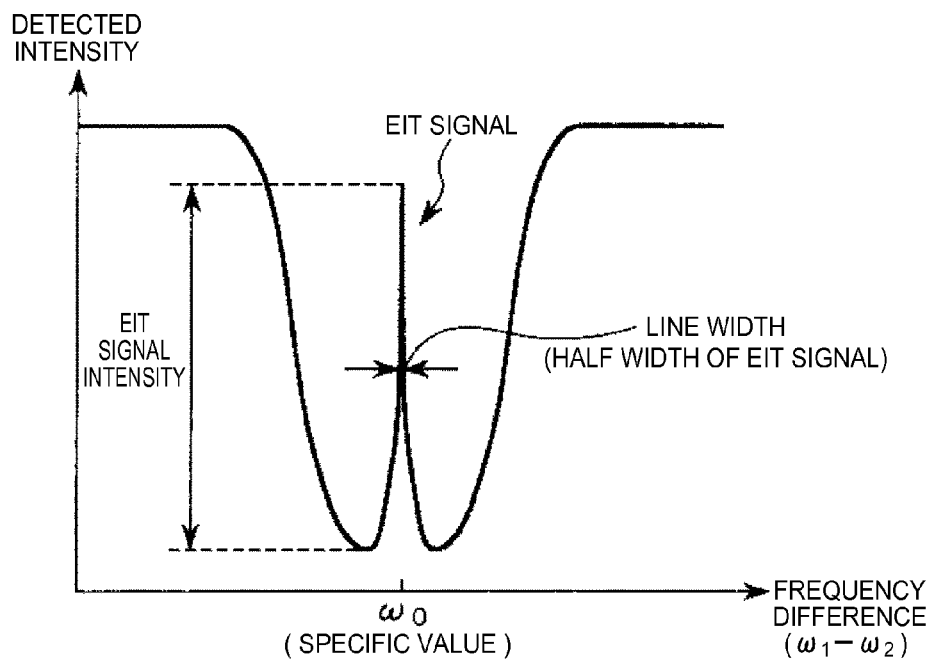
FIG. 3 is a graph showing a relationship between a frequency difference between two lights output from a light output part and light intensity detected in a light detection part.

FIG. 1 is a schematic diagram showing an atomic oscillator (quantum interference device) according to the first embodiment of the invention. Further, FIG. 2 is a diagram for explanation of energy states of an alkali metal, and FIG. 3 is a graph showing a relationship between a frequency difference between two lights output from a light output part and light intensity detected in a light detection part.

An atomic oscillator 1 shown in FIG. 1 is an atomic oscillator utilizing a quantum interference effect. As shown in FIG. 1, the atomic oscillator 1 includes a gas cell 2 (atom cell), a light output part 3, optical components 41, 42, 43, 44, a light detection part 5, a heater 6, a temperature sensor 7, a magnetic field generation part 8, and a control part 10.

First, the principle of the atomic oscillator 1 will be briefly explained.

As shown in FIG. 1, in the atomic oscillator 1, the light output part 3 outputs excitation light LL toward the gas cell 2 and the light detection part 5 detects the excitation light LL transmitted through the gas cell 2.

Within the gas cell 2, a gaseous alkali metal (metal atoms) is enclosed. As shown in FIG. 2, the alkali metal has energy levels of a three-level system, and may take three states of two ground states (ground states 1, 2) at different energy levels and an excited state. Here, the ground state 1 is the energy state lower than the ground state 2.

The excitation light LL output from the light output part 3 includes two kinds of resonance lights 1, 2 having different wavelengths. When the two kinds of resonance lights 1, 2 are applied to the above described gaseous alkali metal, light absorptance (light transmittance) of the resonance lights 1, 2 in the alkali metal changes according to a difference ($\omega 1-\omega 2$) between the frequency $\omega 1$ of the resonance light 1 and the frequency $\omega 2$ of the resonance light 2.

When the difference ($\omega 1-\omega 2$) between the frequency $\omega 1$ of the resonance light 1 and the frequency $\omega 2$ of the resonance light 2 coincides with the frequency corresponding to the energy difference between the ground state 1 and the ground state 2, excitation from the ground states 1, 2 to the excited state is respectively stopped. In this regard, both of the resonance lights 1, 2 are transmitted through the alkali metal, not absorbed. The phenomenon is called a CPT phenomenon or electromagnetically induced transparency (EIT).

For example, in the case where the light output part 3 fixes the frequency $\omega 1$ of the resonance light 1 and changes the frequency $\omega 2$ of the resonance light 2, when the difference ($\omega 1-\omega 2$) between the frequency $\omega 1$ of the resonance light 1 and the frequency $\omega 2$ of the resonance light 2 coincides with the frequency $\omega 0$ corresponding to the energy difference between the ground state 1 and the ground state 2, the detected intensity of the light detection part 5 steeply increases as shown in FIG. 3. The steep signal is detected as an EIT signal. The EIT signal has an eigenvalue determined depending on the kind of alkali metal. Therefore, an oscillator may be formed using the EIT signal.

As below, the respective parts of the atomic oscillator 1 will be sequentially explained in detail.

Gas Cell

A gaseous alkali metal of rubidium, cesium, sodium, or the like is enclosed within the gas cell 2. Further, as appropriate, a rare gas such as argon or neon or an inert gas such as nitride may be enclosed with the alkali metal gas as a buffer gas.

As will be described later, the gas cell 2 has a body part having a through hole and a pair of window parts closing openings of the through hole of the body part, and thereby, an internal space in which the gaseous alkali metal is enclosed is formed.

Light Output Part

The light output part 3 (light source) has a function of outputting excitation light LL that excites alkali metal atoms in the gas cell 2.

More specifically, the light output part 3 outputs the above described two kinds of light having different wavelengths as excitation light LL, particularly, may output the above described resonance light 1 and resonance light 2. The resonance light 1 may excite (resonate) the alkali metal within the gas cell 2 from the above described ground state 1 to the excited state. On the other hand, the resonance light 2 may excite (resonate) the alkali metal within the gas cell 2 from the above described ground state 2 to the excited state.

The light output part 3 is not particularly limited as long as it may output the above described excitation lights. For example, a semiconductor laser including a vertical cavity surface emitting laser (VCSEL) may be used.

The light output part 3 is temperature-controlled to a predetermined temperature by a temperature control element (not shown) (heating resistor, Peltier element, or the like).

Optical Components

The plurality of optical components 41, 42, 43, 44 are respectively provided in the optical path of excitation light LL between the above described light output part 3 and gas cell 2. Here, they are arranged in the order of the optical component 41, the optical component 42, the optical component 43, the optical component 44 from the light output part 3 side toward the gas cell 2 side.

The optical component 41 is a lens. Thereby, the excitation light LL may be applied to the gas cell 2 without waste.

Further, the optical component 41 has a function of parallelizing the excitation light LL. Thereby, reflection of the excitation light LL by the inner wall of the gas cell 2 may be easily prevented. Accordingly, resonance of the excitation light within the gas cell 2 may be preferably generated and, as a result, the oscillation characteristics of the atomic oscillator 1 may be improved.

The optical component 42 is a polarizer. Thereby, the polarization of the excitation light LL from the light output part 3 may be adjusted to a predetermined direction.

The optical component 43 is a neutral density filter (ND filter). Thereby, the intensity of the excitation light LL entering the gas cell 2 may be adjusted (reduced). Accordingly, even when the output of the light output part 3 is larger, the amount of the excitation light entering the gas cell 2 may be set to a desired amount. In the embodiment, the intensity of the excitation light LL passing through the above described optical component 42 and having polarization in the predetermined direction is adjusted by the optical component 43.

The optical component 44 is a $\lambda/4$ wave plate. Thereby, the excitation light LL from the light output part may be converted from linearly-polarized light into circularly-polarized light (right circularly-polarized light or left circularly-polarized light).

Under a condition that the alkali metal atoms within the gas cell 2 are Zeeman-split by the magnetic field of the magnetic field generation part 8 as will be described later, if the linearly-polarized excitation light is applied to the alkali metal atoms, by the interaction between the excitation light and the alkali metal atoms, the alkali metal atoms are Zeeman-split and uniformly distributed at a plurality of levels. As a result, the number of alkali metal atoms at a desired energy level is smaller than the numbers of alkali metal atoms at the other energy levels, and thus, the number of atoms that exhibit a desired EIT phenomenon decreases and the intensity of desired EIT signals decreases. Consequently, the oscillation characteristics of the atomic oscillator 1 are degraded.

On the other hand, under the condition that the alkali metal atoms within the gas cell 2 are Zeeman-split by the magnetic field of the magnetic field generation part 8 as will be described later, if the circularly-polarized excitation light is applied to the alkali metal atoms, by the interaction between the excitation light and the alkali metal atoms, of a plurality of levels at which the alkali metal atoms are Zeeman-split, the number of alkali metal atoms at a desired energy level may be made larger than the numbers of alkali metal atoms at the other energy levels. Accordingly, the number of atoms that exhibit a desired EIT phenomenon increases and the intensity of desired EIT signals increases. Consequently, the oscillation characteristics of the atomic oscillator 1 may be improved.

Light Detection Part

The light detection part 5 has a function of detecting the intensity of the excitation light LL (resonance lights 1, 2) transmitted through the gas cell 2.

The light detection part 5 is not particularly limited as long as it may detect the above described excitation light. For example, a solar cell, a photodetector (light receiving element) including a photodiode may be employed.

Heater

The heater 6 (heating part) has a function of heating the above described gas cell 2 (more specifically, the alkali metal in the gas cell 2). Thereby, the alkali metal in the gas cell 2 may be maintained in the gaseous state at the appropriate concentration.

The heater 6 includes e.g. a heating resistor that generates heat by energization. The heating resistor may be provided in contact with the gas cell 2 or in no contact with the gas cell 2.

For example, when the heating resistor is provided in contact with the gas cell 2, the heating resistor is provided for the respective pair of window parts of the gas cell 2. Thereby, condensation of the alkali metal atoms in the window parts of the gas cell 2 may be prevented. As a result, the characteristics of the atomic oscillator 1 (oscillation characteristics) may be made advantageous for a long period of time. The heating resistor is formed using a material having transmissivity with respect to the excitation light, specifically, e.g. a transparent electrode material of oxide including ITO (Indium Tin Oxide), IZO (Indium Zinc Oxide), $In_2O_3$, $SnO_2$, $SnO_2$ containing Sb, or ZnO containing Al. The heating resistor may be formed using e.g. chemical vapor deposition (CVD) including plasma CVD and thermal CVD, dry plating including vacuum deposition, a sol-gel process, or the like.

Alternatively, when the heating resistor is provided in no contact with the gas cell 2, heat may be transferred from the heating resistor to the gas cell 2 via a member of metal, ceramics, or the like with better thermal conductivity.

Note that the heater 6 is not limited to the above described form as long as it may heat the gas cell 2, but various kinds of heaters may be employed. Or, the gas cell 2 may be heated using a Peltier element in place of the heater 6, or, in conjunction with the heater 6.

Temperature Sensor

The temperature sensor 7 detects the temperature of the heater 6 or the gas cell 2. Further, the amount of generated heat by the above described heater 6 is controlled based on the detection result of the temperature sensor 7. Thereby, the alkali metal atoms within the gas cell 2 may be maintained at a desired temperature.

Note that the position where the temperature sensor 7 is provided is not particularly limited. For example, the sensor may be provided on the heater 6 or on the outer surface of the gas cell 2.

The temperature sensor 7 is not particularly limited, but various kinds of known temperature sensors including a thermistor and a thermocouple may be employed.

Magnetic Field Generation Part

The magnetic field generation part 8 has a function of generating a magnetic field for Zeeman splitting of the plurality of degenerated energy levels of the alkali metal within the gas cell 2. Thereby, by the Zeeman splitting, gaps between the different degenerated energy levels of the alkali metal may be expanded and resolution may be improved. As a result, the precision of the oscillation frequency of the atomic oscillator 1 may be improved.

The magnetic field generation part 8 includes e.g. a Helmholtz coil provided to sandwich the gas cell 2 or a solenoid coil provided to cover the gas cell 2. Thereby, a unidirectional homogeneous magnetic field may be generated within the gas cell 2.

Further, the magnetic field generated by the magnetic field generation part 8 is a constant magnetic field (direct-current magnetic field), however, an alternating-current magnetic field may be superimposed thereon.

Control Part

The control part 10 has a function of respectively controlling the light output part 3, the heater 6, and the magnetic field generation part 8.

The control part 10 has an excitation light control part 12 that controls the frequencies of the resonance lights 1, 2 of the light output part 3, a temperature control part 11 that controls the temperature of the alkali metal in the gas cell 2, and a magnetic field control part 13 that controls the magnetic field from the magnetic field generation part 8.

The excitation light control part 12 controls the frequencies of the resonance lights 1, 2 output from the light output part 3 based on the detection result of the above described light detection part 5. More specifically, the excitation light control part 12 controls the frequencies of the resonance lights 1, 2 output from the light output part 3 so that the above described frequency difference ($\omega 1 - \omega 2$) may be the above described frequency $\omega 0$ unique to the alkali metal.

Here, the excitation light control part 12 includes a voltage-controlled crystal oscillator (oscillation circuit) (not shown), and synchronizes and adjusts the oscillation frequency of the voltage-controlled crystal oscillator based on the sensing result of the light detection part 5 and outputs an output signal of the voltage-controlled crystal oscillator as an output signal of the atomic oscillator 1.

For example, the excitation light control part 12 includes a multiplier (not shown) that frequency-multiplies the output signal from the voltage-controlled crystal oscillator, and superimposed the signal multiplied by the multiplier (high-frequency signal) on a DC bias current and inputs the signal to the light output part 3 as a drive signal. Thereby, the voltage-controlled crystal oscillator is controlled so that the EIT signal may be detected by the light detection part 5, and a signal at a desired frequency is output from the voltage-controlled crystal oscillator. The multiplication rate of the multiplier is e.g., supposing that the desired frequency of the output signal from the atomic oscillator 1 is f, $\omega 0/(2 \times f)$. Thereby, when the oscillation frequency of the voltage-controlled crystal oscillator is f, the light emitting device of semiconductor laser or the like contained in the light output part 3 may be modulated using the signal from the multiplier, and two lights having the frequency difference ($\omega 1 - \omega 2$) being $\omega 0$ may be output.

Further, the temperature control part 11 controls energization to the heater 6 based on the detection result of the temperature sensor 7. Thereby, the gas cell 2 may be maintained within a desired temperature range. For example, the gas cell 2 is temperature-controlled to e.g. about 70° C. by the heater 6.

Furthermore, the magnetic field control part 13 controls energization to the magnetic field generation part 8 so that the magnetic field generated by the magnetic field generation part 8 may be constant.

The control part 10 is provided on e.g. an IC chip mounted on a substrate.

As above, the configuration of the atomic oscillator 1 is briefly explained.

Detailed Explanation of Gas Cell

Figure 4B:
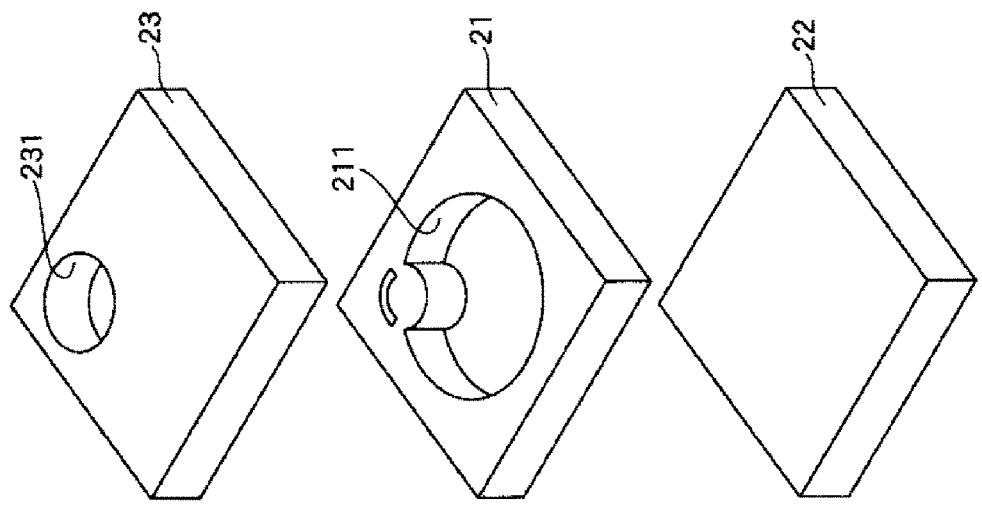
FIG. 4B is an exploded perspective view of the atom cell shown in FIG. 4A.
Figure 4A:
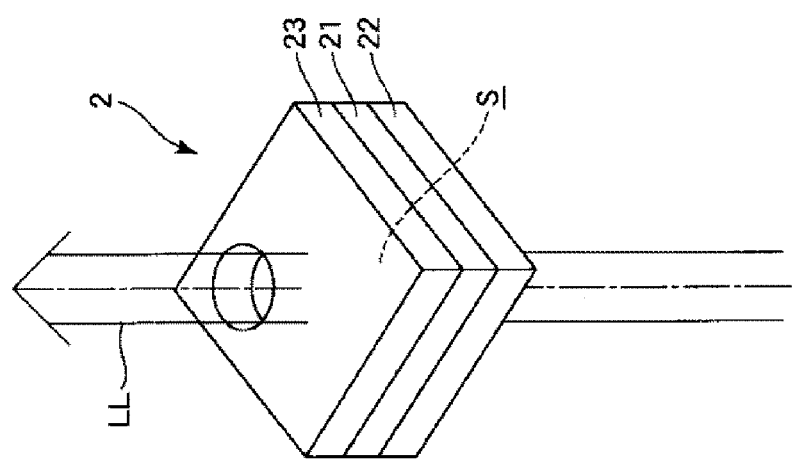
FIG. 4A is a perspective view of an atom cell of the atomic oscillator shown in FIG. 1.
Figure 5A:
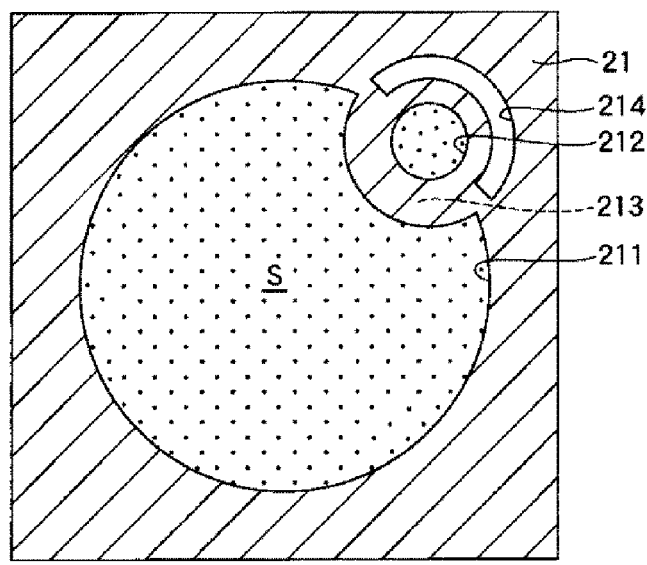
FIG. 5A is a cross-sectional view of the atom cell shown in FIGS. 4A and 4B.
Figure 5B:
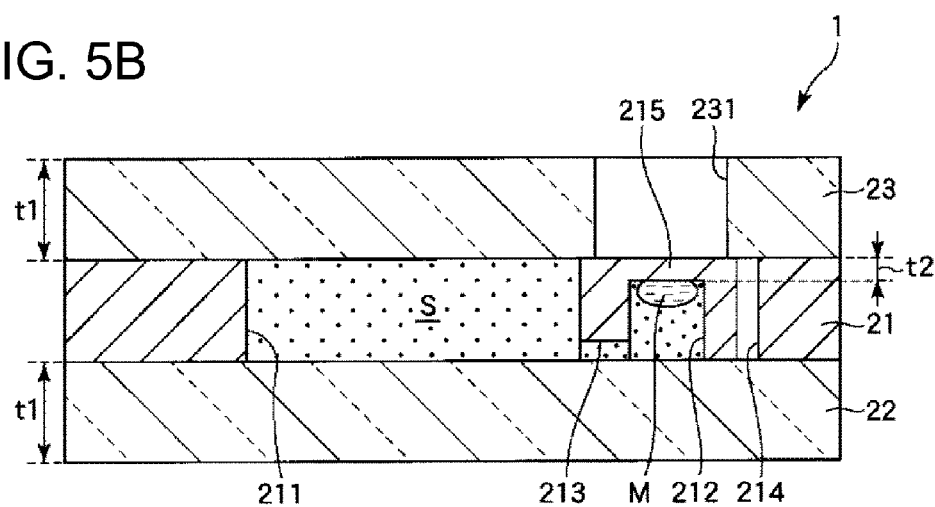
FIG. 5B is a longitudinal sectional view of the atom cell shown in FIGS. 4A and 4B.

FIG. 4A is a perspective view of an atom cell of the atomic oscillator shown in FIG. 1, and FIG. 4B is an exploded perspective view of the atom cell shown in FIG. 4A. FIG. 5A is a cross-sectional view of the atom cell shown in FIGS. 4A and 4B, and FIG. 5B is a longitudinal sectional view of the atom cell shown in FIGS. 4A and 4B. As below, for convenience of explanation, the upside in FIG. 5B is referred to "upper" and the downside is referred to "lower".

As shown in FIGS. 4A to 5B, the gas cell 2 has a body part 21 and a pair of window parts 22, 23 provided with the body part 21 in between. In the gas cell 2, the body part 21 is provided between the pair of window parts 22, 23, and the body part 21 and the pair of window parts 22, 23 section and form (configure) an internal space S in which the gaseous alkali metal is enclosed.

More specifically, the body part 21 has a plate shape having a thickness direction in a vertical direction. In the body part 21, a cylindrical through hole 211 that penetrates the body part 21 in the thickness direction (vertical direction), a cylindrical recessed part 212 that opens to the lower surface of the body part 21, a groove 213 (recessed part) that opens to the lower surface of the body part 21 and communicates the through hole 211 and the recessed part 212, and a through hole 214 that penetrates the body part 21 in the thickness direction at the opposite side to the through hole 211 with respect to the through hole 214 are formed.

The constituent material of the body part 21 is not particularly limited, but includes a glass material, crystal, metal material, resin material, silicon material, or the like. Of them, one of the glass material, crystal, and silicon material is preferably used, and the silicon material is more preferably used. Thereby, even when the small gas cell 2 having a width and a height equal to or less than 10 mm is formed, the high-precision body part 21 may be easily formed by a microfabrication technology of etching or the like. Particularly, microfabrication by etching can be performed on silicon. Therefore, the body part 21 is formed using silicon, and thereby, even when the gas cell 2 is downsized, the body part 21 may be formed easily and precisely. Further, generally, the window parts 22, 23 are formed using glass, and the silicon is better in thermal conductivity than glass. Therefore, heat radiation of a bottom part 215 as a thinner part, which will be described later, may be made better. Further, when the window parts 22, 23 are formed using glass, the body part 21 and the window parts 22, 23 may be easily and air-tightly bonded by anodic bonding and reliability of the gas cell 2 may be made better.

The window part 22 is bonded to the lower surface of the body part 21 and the window part 23 is bonded to the upper surface of the body part 21. Thereby, the openings at the lower end sides of the through holes 211, 214 and the openings of the recessed part 212 and the groove 213 are closed by the window part 22 and the openings at the upper end sides of the through holes 211, 214 are closed by the window part 23.

The method of bonding the body part 21 and the window parts 22, 23 is determined according to the constituent materials and not particularly limited as long as it enables air-tight bonding. For example, a bonding method using an adhesive agent, direct bonding, anodic bonding, surface activated bonding, or the like may be employed, and the direct bonding or anodic bonding is preferably used.

Thereby, the body part 21 and the window parts 22, 23 may be easily air-tightly bonded and reliability of the gas cell 2 may be made better.

The respective window parts 22, 23 bonded to the body part 21 have transmissivity with respect to excitation light from the above described light output part 3. Further, one window part 22 is a light incident-side window part that the excitation light LL enters into the space S of the gas cell 2 and the other window part 23 is a light exiting-side window part that the excitation light LL exits from within the space S of the gas cell 2.

Further, the window parts 22, 23 respectively have plate shapes. Here, the window parts 22, 23 respectively form "substrates" stacked on the body part 21.

In the embodiment, a through hole 231 that penetrates the window part 23 in the thickness direction is formed in the position corresponding to the recessed part 212 of the body part 21. Thereby, the outer surface of the bottom part 215 of the recessed part 212 of the body part 21 is exposed to the outside via the through hole 231. Accordingly, the heat of the bottom part 215 of the recessed part 212 of the body part 21 may be efficiently radiated or cooled through within the through hole 231.

Further, in the embodiment, the through hole 231 is hollow. Therefore, the interior of the through hole 231 is under the same condition as the atmosphere surrounding the gas cell 2. For example, when the gas cell 2 is installed under a reduced-pressure atmosphere, the interior of the through hole 231 is also under the reduced-pressure condition. Note that the through hole 231 may be filled with a material different from the material forming the window part 23 and, in this case, it is preferable that the material has a higher coefficient of thermal conductivity than the material forming the window part 23.

The constituent material of the window parts 22, 23 (substrates) is not particularly limited as long as it may have the above described transmissivity with respect to the excitation light, but includes e.g. a glass material, crystal, or the like, and the glass material is preferably used. Thereby, the window parts 22, 23 having transmissivity with respect to the excitation light may be realized. Further, when the body part 21 is formed using silicon, the window parts 22, 23 are formed using glass, and thereby, the body part 21 and the window parts 22, 23 may be easily air-tightly bonded by anodic bonding and reliability of the gas cell 2 may be made better. Note that, depending on the thickness of the window parts 22, 23 and the intensity of the excitation light, the window parts 22, 23 may be formed using silicon. In this case, the body part 21 and the window parts 22, 23 may be directly bonded.

In the internal space S as a space within the through hole 211 closed by the window parts 22, 23, a gaseous alkali metal is mainly housed. The gaseous alkali metal housed within the internal space S is excited by the excitation light LL. That is, at least a part of the internal space S forms "light passage space" through which the excitation light LL passes. In the embodiment, the cross section of the internal space S has a circular shape and, on the other hand, the cross section of the light passage space has a similarity shape to the cross section of the internal space S (i.e., a circular shape) and is set to be slightly smaller than the cross section of the internal space S. Note that the cross section of the internal space S is not limited to the circular shape, but may be e.g. a polygonal shape such as a rectangular shape or pentagonal shape, an oval shape, or the like.

Further, the space within the recessed part 212 communicates with the internal space S via the space within the groove 213, and a liquid-state or solid-state alkali metal M is housed therein. That is, the space within the recessed part 212 is a space that forms a part of the internal space S or communicates with the internal space S and forms "metal reservoir part" in which the liquid-state or solid-state alkali metal M is placed.

More specifically, the liquid-state or solid-state alkali metal M is placed on the inner surface (the surface inside of the groove 213) of the bottom part 215 of the recessed part 212. In the embodiment, the space within the recessed part 212 has a circular shape. Note that the cross section shape of the space within the recessed part 212 is not limited to the circular shape, but may be e.g. a polygonal shape such as a rectangular shape or pentagonal shape, an oval shape, or the like.

Further, the thickness t2 of the bottom part 215 of the recessed part 212 is thinner than the respective thicknesses t1 of the window parts 22, 23. Here, the bottom part 215 is "wall part" between the space within the recessed part 212 (the space forming the metal reservoir part) and the outside, and forms "thinner part" having a smaller thickness than the window parts 22, 23. Thereby, the heat of the inner surface of the bottom part 215 may be efficiently radiated or cooled through the through hole 231 of the window part 23. As a result, the liquid-state or solid-state alkali metal M may be easily selectively condensed on the inner surface of the bottom part 215. In other words, the alkali metal may be harder to be condensed on the respective inner surfaces of the window parts 22, 23 than on the inner surface of the bottom part 215. Accordingly, the condensation of the alkali metal on the respective inner surfaces of the window parts 22, 23 may be reduced.

Further, it is only necessary that the thickness t2 of the bottom part 215 of the recessed part 212 is thinner than the respective thicknesses t1 of the window parts 22, 23, and, relative to the thickness t1, the thickness is preferable from 0.01 to 0.8, more preferable from 0.1 to 0.6, and even more preferable from 0.2 to 0.4. Thereby, heat radiation of the bottom part 215 may be made better while mechanical strength necessary for the bottom part 215 is secured.

The space within the through hole 214 is filled with atmospheric air or under a vacuum (reduced-pressure) condition, and functions as a thermal insulation part that reduces heat dissipation from the side wall of the recessed part 212. In the embodiment, the through hole 214 is formed along the side wall of the recessed part 212 at the opposite side to the internal space S of the recessed part 212.

The thickness of the wall part between the recessed part 212 and the through hole 214 is thinner than the respective thicknesses t1 of the window parts 22, 23. Thereby, as described above, the space within the through hole 214 may effectively function as the thermal insulation part.

According to the gas cell 2 having the above described configuration, the thickness t2 of the bottom part 215 (wall part, thinner part) between the space (region) within the recessed part 212 and the outside is thinner than the thickness t1 of the window parts 22, 23, and the heat of the bottom part 215 is radiated or cooled more easily than the window parts 22, 23. Therefore, the excessive alkali metal M may be condensed in a liquid state or solid state on the inner surface of the bottom part 215 more easily than on the inner surfaces of the window parts 22, 23. Accordingly, even when the gas cell 2 is downsized, the excessive alkali metal M may be selectively and efficiently condensed on the inner surface of the bottom part 215 while the condensation of the excessive alkali metal on the inner surfaces of the window parts 22, 23 is reduced. As a result, frequency stability may be improved.

In the embodiment, in the gas cell 2 as a structure including the body part 21 and the window parts 22, 23, a recessed part formed by the through hole 231 is provided in the position overlapping with the space within the recessed part 212 (metal reservoir part) as seen from the thickness direction of the window parts 22, 23. Thereby, the thinner part (bottom part 215) may be provided at the window part 23 side of the gas cell 2. Further, the gas cell 2 may be easily and precisely formed using etching. Accordingly, the gas cell 2 may be easily downsized.

Further, the recessed part formed by the above described through hole 231 penetrates the window part 23 (substrate), and the thinner part (bottom part 215) may be formed using the constituent material of the body part 21. Accordingly, as the constituent material of the body part 21, a material having better thermal conductivity than the constituent material of the window part 22 is selected and used, and thereby, heat radiation of the thinner part may be improved.

Second Embodiment

Next, the second embodiment of the invention will be explained.

Figure 6A:
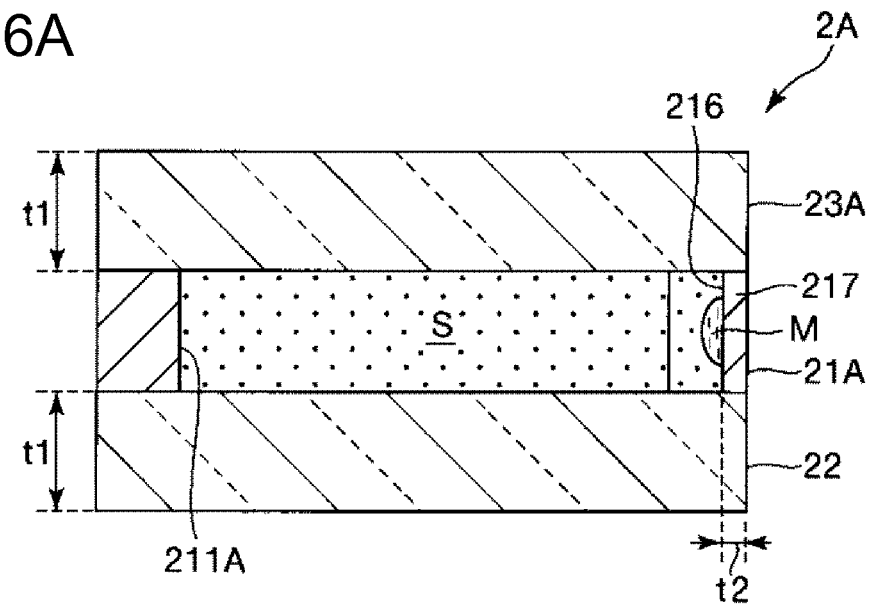
FIG. 6A is a longitudinal sectional view of an atom cell according to the second embodiment of the invention.
Figure 6B:
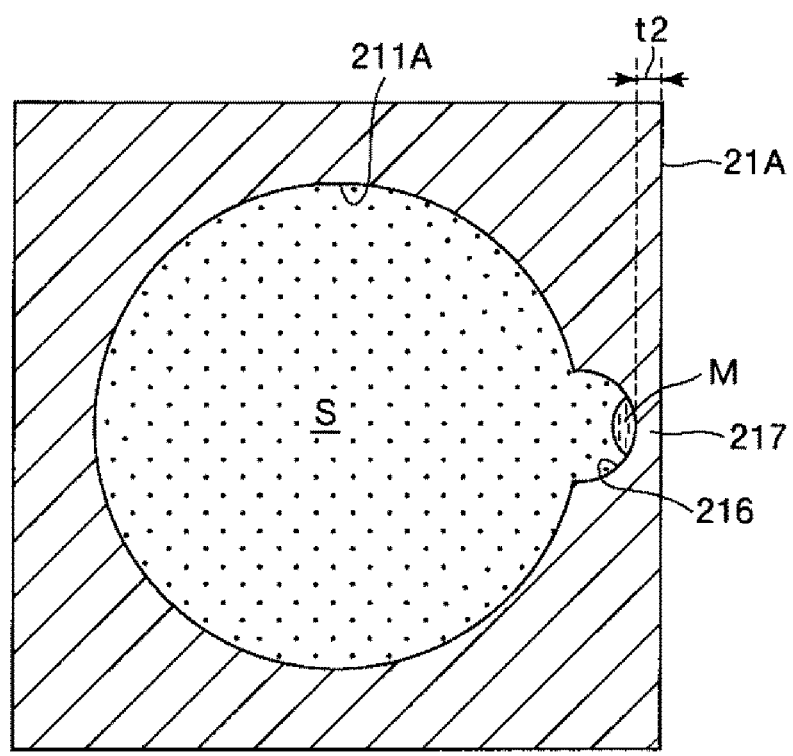
FIG. 6B is a cross-sectional view of the atom cell shown in FIG. 6A.

FIG. 6A is a longitudinal sectional view of an atom cell according to the second embodiment of the invention, and FIG. 6B is a cross-sectional view of the atom cell shown in FIG. 6A.

The embodiment is the same as the above described first embodiment except the difference in the configuration of the metal reservoir part of the atom cell.

Note that, in the following explanation, the second embodiment will be explained with a focus on the difference from the above described embodiment, and the explanation of the same items will be omitted.

A gas cell 2A (atom cell) shown in FIGS. 6A and 6B includes a body part 21A and a window part 23A in place of the body part 21 and the window part 23 of the first embodiment.

The body part 21A has a plate shape and, in the body part 21A, a through hole 211A that penetrates the body part 21A in the thickness direction (vertical direction) is formed. A recessed part 216 (groove) penetrating the body part 21A in the thickness direction is formed in a part in the circumferential direction of the side surface of the through hole 211A. In the embodiment, the cross section of the through hole 211A has a circular shape in its main part and the cross section of the recessed part 216 has a nearly semi-circular shape. Note that, obviously, the respective cross section shapes of the through hole 211A and the recessed part 216 are not limited to those shown in the drawings.

A window part 22 is bonded to the lower surface of the body part 21A and, on the other hand, the window part 23A is bonded to the upper surface of the body part 21A. Thereby, the opening at the lower end side of the through hole 211A is closed by the window part 22 and the opening at the upper end side of the through hole 211A is closed by the window part 23A. In the embodiment, the window part 23A has the same configuration as the window part 22.

In the internal space S as a space within the through hole 211A closed by the window parts 22, 23A, a gaseous alkali metal is mainly housed. Further, the space within the recessed part 216 communicates with the internal space S, and a liquid-state or solid-state alkali metal M is housed therein. That is, the space within the recessed part 216 forms "metal reservoir part".

Here, the outer surface of a bottom part 217 of the recessed part 216 is exposed to the outside, and the thickness t2 of the bottom part 217 of the recessed part 216 is thinner than the respective thicknesses t1 of the window parts 22, 23A. Here, the bottom part 217 forms "thinner part". Thereby, the heat of the inner surface of the bottom part 217 may be efficiently radiated or cooled. As a result, the solid-state or liquid-state alkali metal M may be easily selectively condensed on the inner surface of the bottom part 217.

According to the above described gas cell 2A of the second embodiment, the frequency stability may be improved.

Third Embodiment

Next, the third embodiment of the invention will be explained.

Figure 7A:
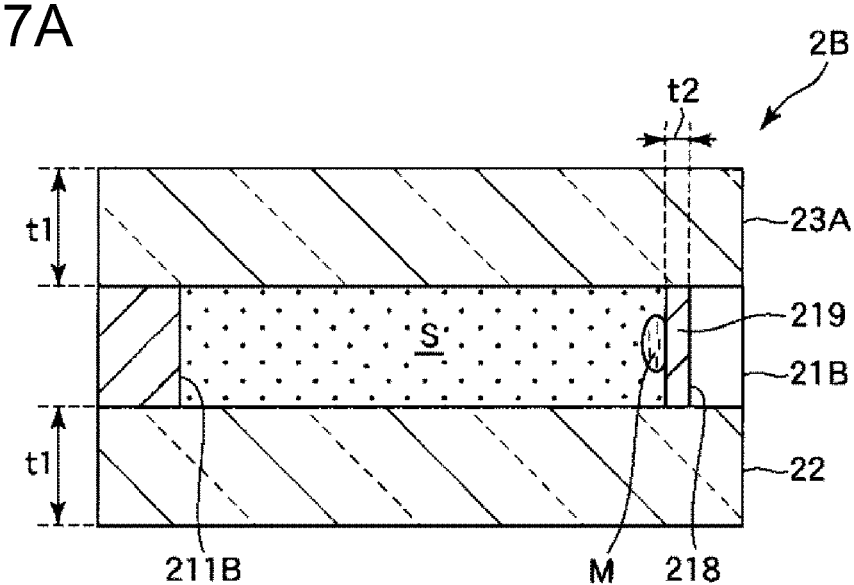
FIG. 7A is a longitudinal sectional view of an atom cell according to the third embodiment of the invention.
Figure 7B:
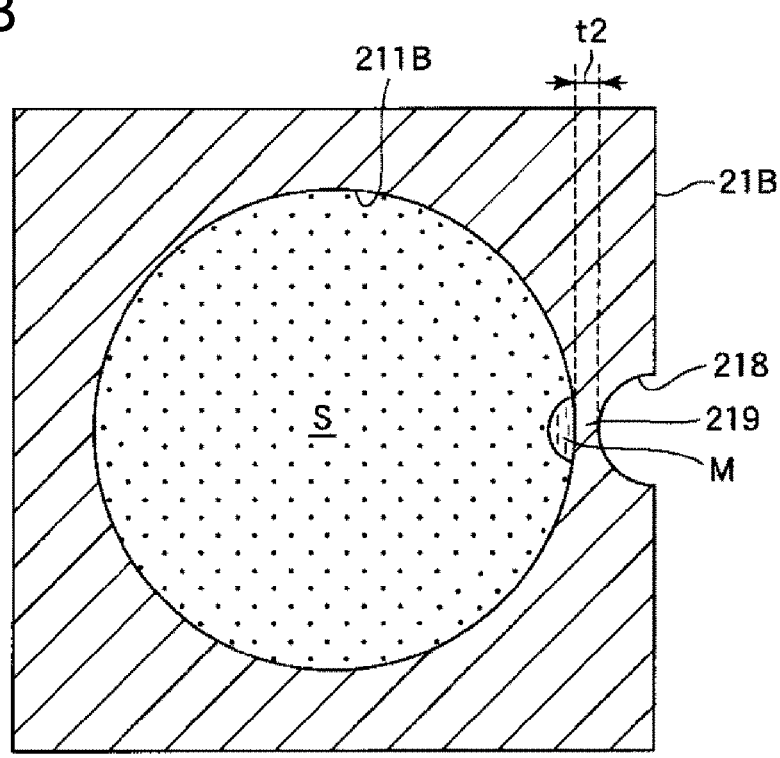
FIG. 7B is a cross-sectional view of the atom cell shown in FIG. 7A.

FIG. 7A is a longitudinal sectional view of an atom cell according to the third embodiment of the invention, and FIG. 7B is a cross-sectional view of the atom cell shown in FIG. 7A.

The embodiment is the same as the above described first embodiment except the difference in the configuration with respect to the metal reservoir part of the atom cell.

Note that, in the following explanation, the third embodiment will be explained with a focus on the difference from the above described embodiments, and the explanation of the same items will be omitted.

A gas cell 2B (atom cell) shown in FIGS. 7A and 7B includes a body part 21B and a window part 23A in place of the body part 21 and the window part 23 of the first embodiment.

The body part 21B has a plate shape and, in the body part 21B, a through hole 211B that penetrates the body part 21B in the thickness direction (vertical direction) and a recessed part 218 (groove) opening to the side surface of the body part 21B and penetrating the body part 21B in the thickness direction are formed. In the embodiment, the cross section of the through hole 211B has a circular shape and the cross section of the recessed part 218 has a nearly semi-circular shape. Note that, obviously, the respective cross section shapes of the through hole 211B and the recessed part 218 are not limited to those shown in the drawings.

A window part 22 is bonded to the lower surface of the body part 21B and, on the other hand, the window part 23A is bonded to the upper surface of the body part 21B. Thereby, the opening at the lower end side of the through hole 211B is closed by the window part 22 and the opening at the upper end side of the through hole 211B is closed by the window part 23A.

In the internal space S as a space within the through hole 211B closed by the window parts 22, 23A, a gaseous alkali metal is mainly housed. Further, of the inner wall surface of the internal space S, in the part corresponding to the recessed part 218, i.e., on the inner surface of a bottom part 219 of the recessed part 218 (the surface at the internal space S side), a liquid-state or solid-state alkali metal M is placed. That is, a part of the internal space S forms "metal reservoir part".

Further, the bottom part 219 of the recessed part 218 forms a part of the wall part isolating between the internal space S and the outside, and the wall surface of the recessed part 218 is exposed to the outside. Further, the thickness t2 of the bottom part 219 of the recessed part 218 is thinner than the respective thicknesses t1 of the window parts 22, 23A. Here, the bottom part 219 forms "thinner part". Thereby, the heat of the surface of the bottom part 219 at the internal space S side may be efficiently radiated or cooled. As a result, the solid-state or liquid-state alkali metal M may be easily selectively condensed on the surface of the bottom part 219 at the internal space S side. Further, in the embodiment, when many gas cells 2B are manufactured from a wafer, the thickness of the bottom part 219 is harder to be affected by the precision of dicing.

According to the above described gas cell 2B of the third embodiment, the frequency stability may be improved.

Fourth Embodiment

Next, the fourth embodiment of the invention will be explained.

Figure 8B:
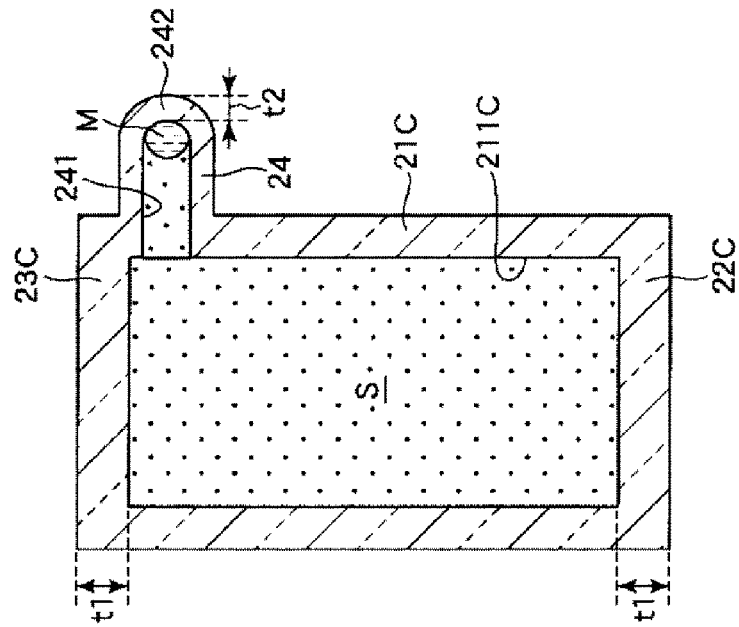
FIG. 8B is a longitudinal sectional view of the atom cell shown in FIG. 8A.
Figure 8A:
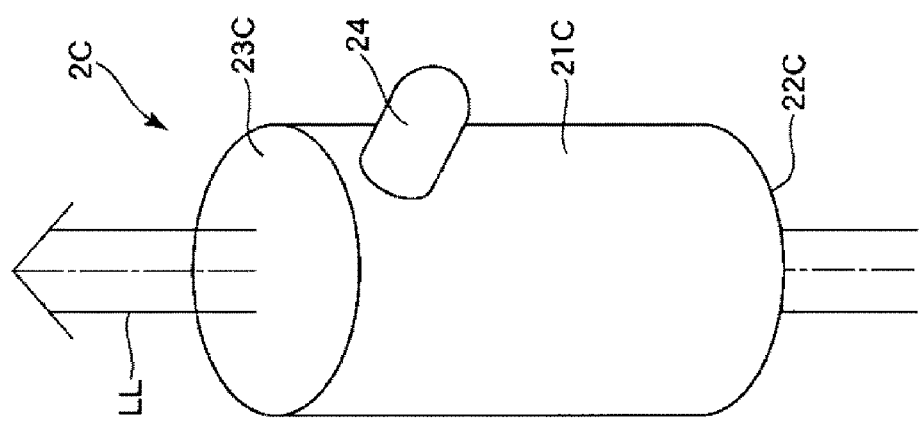
FIG. 8A is a perspective view of an atom cell according to the fourth embodiment of the invention.

FIG. 8A is a perspective view of an atom cell according to the fourth embodiment of the invention, and FIG. 8B is a longitudinal sectional view of the atom cell shown in FIG. 8A.

The embodiment is the same as the above described first embodiment except the application of the invention to the atom cell manufactured by glasswork.

Note that, in the following explanation, the fourth embodiment will be explained with a focus on the difference from the above described embodiments, and the explanation of the same items will be omitted.

A gas cell 2C (atom cell) shown in FIGS. 8A and 8B includes a tubular body part 21C having a through hole 211C, a pair of window parts 22C, 23C closing openings on both ends of the through hole 211C, and a tubular metal reservoir part 24 having a bottom projecting from the side surface of the body part 21C toward a side. The gas cell 2C may be manufactured by glasswork by combining glass pipes and plates.

In the internal space S as a space within the through hole 211C closed by the window parts 22C, 23C, a gaseous alkali metal is mainly housed. Further, the metal reservoir part 24 has a recessed part 241 communicating with the internal space S, and a liquid-state or solid-state alkali metal M is placed on the inner surface of a bottom part 242 of the recessed part 241.

The bottom part 242 of the recessed part 241 forms a part of the wall part isolating between the internal space S and the outside and is exposed to the outside. Further, the thickness t2 of the bottom part 242 of the recessed part 241 is thinner than the respective thicknesses t1 of the window parts 22C, 23C. Here, the bottompart 242 forms "thinner part". Thereby, the heat of the surface of the bottom part 242 at the internal space S side may be efficiently radiated or cooled. As a result, the solid-state or liquid-state alkali metal M may be easily selectively condensed on the surface of the bottom part 242 at the internal space S side.

According to the above described gas cell 2C of the fourth embodiment, the frequency stability may be improved.

Fifth Embodiment

Next, the fifth embodiment of the invention will be explained.

Figure 9:
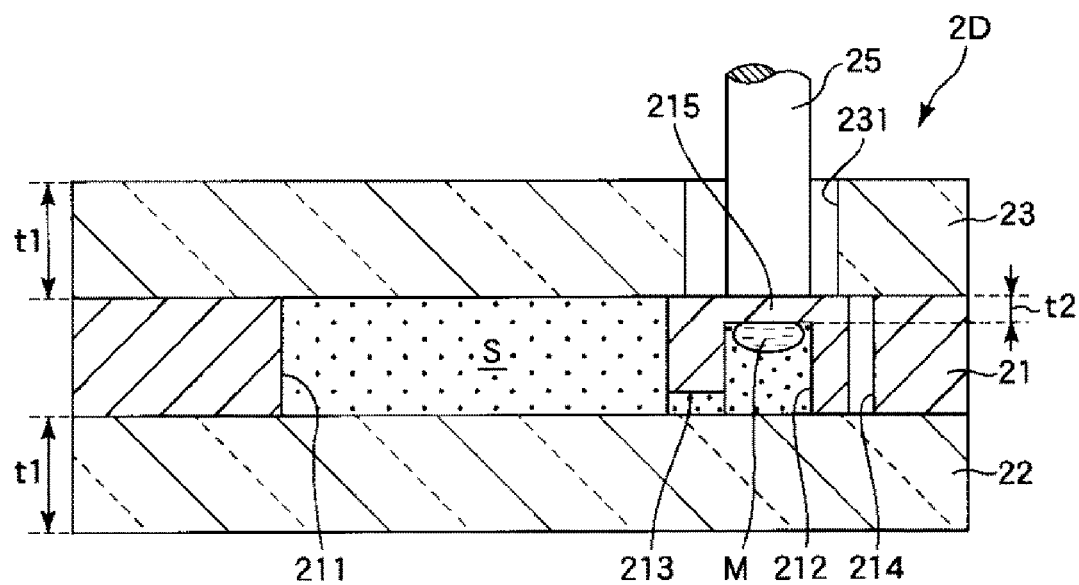
FIG. 9 is a longitudinal sectional view showing an atom cell according to the fifth embodiment of the invention.

FIG. 9 is a longitudinal sectional view showing an atom cell according to the fifth embodiment of the invention.

The embodiment is the same as the above described first embodiment except the addition of a cooling unit configured to cool the metal reservoir part.

Note that, in the following explanation, the fifth embodiment will be explained with a focus on the difference from the above described embodiments, and the explanation of the same items will be omitted.

A gas cell 2D (atom cell) shown in FIG. 9 includes a cooling member 25 connected to the outer surface of a bottom part 215 of a recessed part 212 formed in a body part 21.

The cooling member 25 is connected to the body part 21 through a through hole 231 of a window part 23, and the end part opposite to the body part 21 is connected to e.g. a heat sink, Peltier element, or the like (not shown). Thereby, even when the pressure around the gas cell 2D is reduced, the heat of the bottom part 215 may be efficiently radiated or cooled by thermal conduction via the cooling member 25. The cooling member 25 forms a "cooling unit" configured to cool the bottom part 215, and thereby, the heat of the bottom part 215 may be radiated or cooled more efficiently.

In the embodiment, the cooling member 25 is provided in no contact with the window part 23. Thereby, cooling of the window part 23 may be reduced.

As the constituent material of the cooling member 25, a material having better thermal conductivity, e.g. a metal such as aluminum or copper may be used.

According to the above described gas cell 2D of the fifth embodiment, the frequency stability may be improved.

2. Electronic Apparatus

The above described atomic oscillators may be incorporated into various kinds of electronic apparatuses. The electronic apparatuses have advantageous reliability.

As below, an electronic apparatus according to the invention will be explained.

Figure 10:
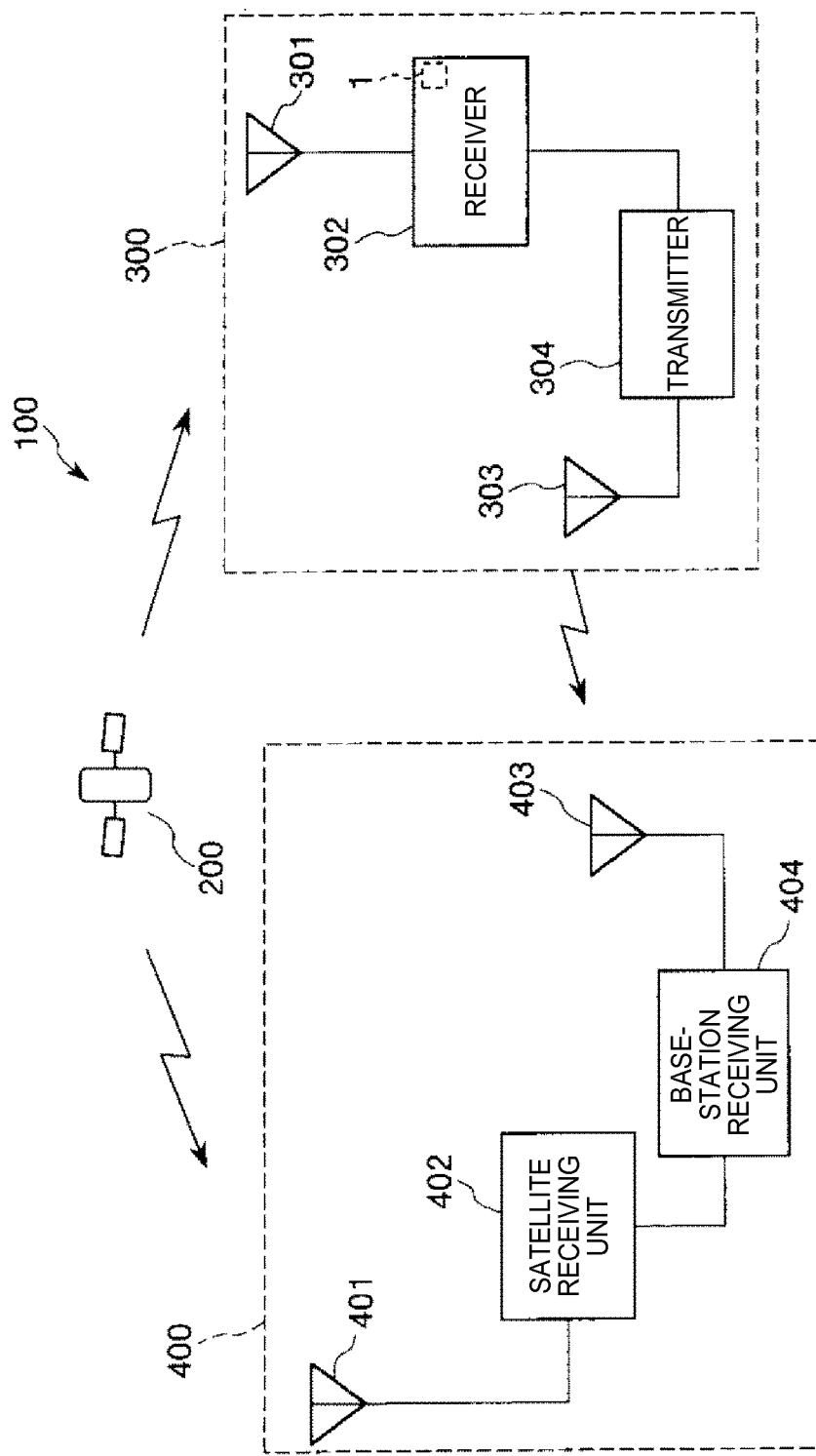
FIG. 10 shows a schematic configuration when the atomic oscillator according to the invention is used for a positioning system utilizing a GPS satellite.

FIG. 10 shows a schematic configuration when the atomic oscillator according to the invention is used for a positioning system utilizing a GPS satellite.

A positioning system 100 shown in FIG. 10 includes a GPS satellite 200, a base station apparatus 300, and a GPS receiving apparatus 400.

The GPS satellite 200 transmits positioning information (GPS signals).

The base station apparatus 300 includes a receiver 302 that precisely receives the positioning information from the GPS satellite 200 via an antenna 301 installed in an electronic reference point (GPS continuous observation station), and a transmitter 304 that transmits the positioning information received by the receiver 302 via an antenna 303.

Here, the receiver 302 is an electronic device including the above described atomic oscillator according to the invention as a reference frequency oscillation source thereof. The receiver 302 has advantageous reliability. Further, the positioning information received by the receiver 302 is transmitted by the transmitter 304 in real time.

The GPS receiving apparatus 400 includes a satellite receiver unit 402 that receives the positioning information from the GPS satellite 200 via an antenna 401 and a base-station receiving unit 404 that receives the positioning information from the base station apparatus 300 via an antenna 403.

3. Moving Object

Figure 11:
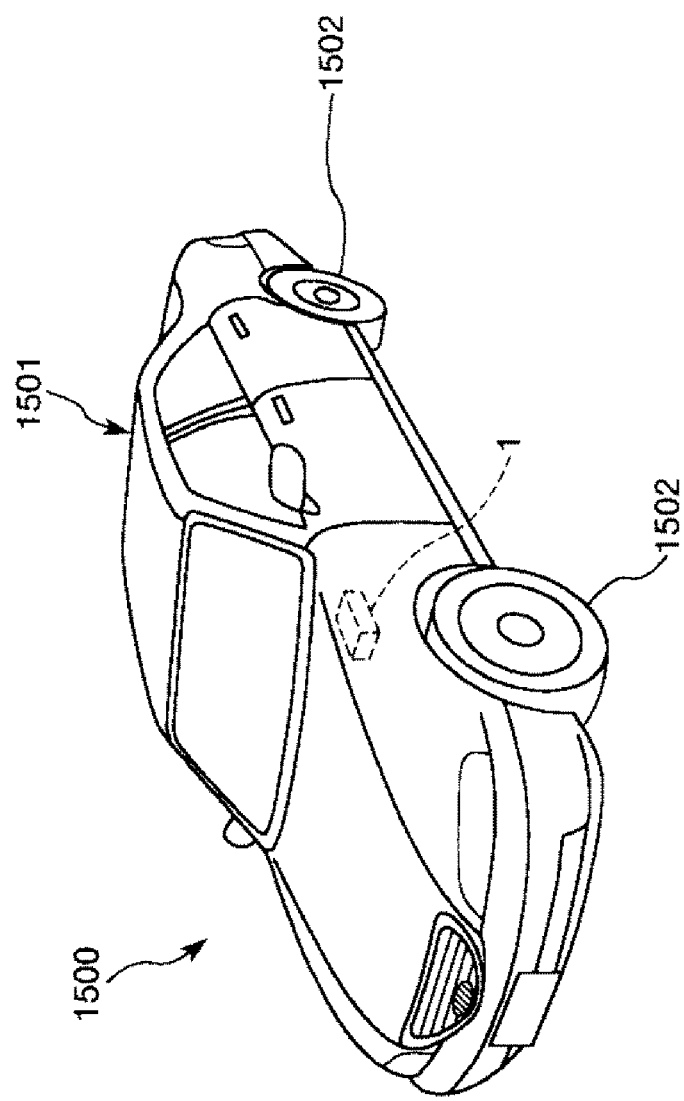
FIG. 11 shows an example of a moving object according to the invention.

FIG. 11 shows an example of a moving object according to the invention.

In the drawing, a moving object 1500 includes a vehicle body 1501 and a four wheels 1502, and is adapted to turn the wheels 1502 by a power source (engine) (not shown) provided in the vehicle body 1501. The moving object 1500 contains the atomic oscillator 1.

According to the moving object, advantageous reliability may be exhibited.

Note that the electronic apparatus according to the invention is not limited to the above described apparatus, but may be applied to e.g. a cell phone, a digital still camera, an inkjet ejection device (e.g. an inkjet printer), a personal computer (mobile personal computer, laptop personal computer), a television, a video camera, a video tape recorder, a car navigation system, a pager, a personal digital assistance (with or without communication function), an electronic dictionary, a calculator, an electronic game machine, a word processor, a work station, a videophone, a security television monitor, electronic binoculars, a POS terminal, a medical device (e.g. an electronic thermometer, a sphygmomanometer, a blood glucose meter, an electrocardiographic measurement system, an ultrasonic diagnostic system, or an electronic endoscope), a fish finder, various measurement instruments, meters and gauges (for example, meters for vehicles, airplanes, and ships), a flight simulator, digital terrestrial broadcasting, a cell phone base station, or the like.

The atom cell, the quantum interference device, the atomic oscillator, the electronic apparatus, and the moving object are explained based on the illustrated embodiments, however, the invention is not limited to those.

Further, the configurations of the respective parts according to the invention may be replaced by arbitrary configurations that exhibit the same functions as those of the above described embodiments, or arbitrary configurations may be added.

Furthermore, in the invention, arbitrary configurations of the above described respective embodiments may be combined.

In addition, in the above described embodiments, the case where the atom cell according to the invention is used for the quantum interference device for resonance transition of cesium or the like utilizing the quantum interference effect by two kinds of lights having different wavelengths is explained as an example, however, the atom cell according to the invention may be used for a double resonance device for resonance transition of rubidium or the like utilizing a double resonance phenomenon by light and microwave, not limited to that.

What is claimed is:

1. An atom cell comprising:
   a body member that has:
      an internal space in which a first metal is enclosed in a gaseous state; and
      a metal reservoir that is spaced apart from the internal space via a communication path communicating with the internal space, a second metal being placed in the metal reservoir in a liquid state or a solid state;
   first and second windows that are provided both sides of the body member, respectively;
   a substrate including the first window, the substrate being stacked on the body member; and
   a through-hole provided in the substrate at a position overlapping with the metal reservoir as seen from a thickness direction of the substrate,
   wherein the metal reservoir includes a wall which is directly adjacent to an outside of the atom cell, and a thickness of the wall is thinner than a thickness of one of the first and second windows, and the second metal is attached on an inner surface of the wall, and
   wherein the through-hole penetrates the substrate so that an outer surface of the wall is exposed to the outside of the atom cell.

2. The atom cell according to claim 1, wherein the body member contains silicon.

3. The atom cell according to claim 2, wherein the substrate contains glass.

4. The atom cell according to claim 1, wherein the body member and the substrate are directly bonded or anodically bonded to each other.

5. The atom cell according to claim 1, further comprising a cooling device that is configured to cool the wall of the metal reservoir.

6. A quantum interference device comprising the atom cell according to claim 1.

7. An atomic oscillator comprising the atom cell according to claim 1.

8. An electronic apparatus comprising the atom cell according to claim 1.

9. A moving object comprising the atom cell according to claim 1.

10. An atom cell comprising:
a body member that has:
   an internal space in which a first metal is enclosed in a gaseous state; and
   a metal reservoir that is spaced apart from the internal space via a communication path communicating with the internal space, in which a second metal is placed in a liquid state or a solid state;
first and second substrates that are provided both sides of the body member, respectively;
first and second windows that are respectively formed in the first and second substrates; and
a through-hole that is formed in the second substrate at a position directly adjacent to the metal reservoir in a stacking direction of the body member and the first and second substrates, the through-hole penetrating the second substrate,
   wherein the metal reservoir includes a wall which is directly adjacent to the through-hole, and a thickness of the wall is thinner than a thickness of one of the first and second windows.

* * * * *